United States Patent
Moser et al.

(10) Patent No.: US 10,770,826 B2
(45) Date of Patent: Sep. 8, 2020

(54) ADAPTER FOR CONNECTING A TRANSMISSION LINE TO A FIELD DEVICE

(71) Applicant: Endress + Hauser Flowtec AG, Reinach (CH)

(72) Inventors: Thierry Moser, Sierentz (FR); Daniel Kollmer, Maulburg (DE)

(73) Assignee: ENDRESS + HAUSER FLOWTEC AG, Reinach (CH)

( * ) Notice: Subject to any disclaimer, the term of this patent is extended or adjusted under 35 U.S.C. 154(b) by 0 days.

(21) Appl. No.: 15/577,850

(22) PCT Filed: Jun. 14, 2016

(86) PCT No.: PCT/EP2016/063538
§ 371 (c)(1),
(2) Date: Nov. 29, 2017

(87) PCT Pub. No.: WO2016/207014
PCT Pub. Date: Dec. 29, 2016

(65) Prior Publication Data
US 2018/0151977 A1  May 31, 2018

(30) Foreign Application Priority Data

Jun. 26, 2015  (DE) .......................... 10 2015 110 350

(51) Int. Cl.
*H01R 13/648* (2006.01)
*H01R 13/52* (2006.01)
(Continued)

(52) U.S. Cl.
CPC ....... *H01R 13/5202* (2013.01); *H01R 13/527* (2013.01); *H01R 24/76* (2013.01); *H02G 3/088* (2013.01); *H01R 13/5216* (2013.01)

(58) Field of Classification Search
CPC .......... H01R 2103/00; H01R 13/65802; H01R 31/06; H01R 13/5216
(Continued)

(56) References Cited

U.S. PATENT DOCUMENTS 4,454,381 A * 6/1984 Ito .......................... H01B 17/30
174/151
5,278,357 A * 1/1994 Yamanashi ............. F16H 57/04
174/151
(Continued)

FOREIGN PATENT DOCUMENTS

| EP | 2 439 818 A1 | 4/2012 |
| JP | 3257427 B2 | 2/2002 |
| WO | 2013/172846 A1 | 11/2013 |

OTHER PUBLICATIONS

International Search Report, EPO, The Netherlands, dated Sep. 12, 2016.

*Primary Examiner* — Thanh Tam T Le
(74) *Attorney, Agent, or Firm* — Bacon & Thomas, PLLC

(57) ABSTRACT

A pressure resistant adapter, for connecting a transmission line to a field device has a shell, insertable into a wall of a housing of the field device. The shell has an interior open to an interior of the housing and closed to the exterior by an end wall of the shell. An insert, installed in the shell, includes a base element and a projection protruding out of the shell through an opening in the end wall of the shell. The base element has a basal area greater than a basal area of the opening. A connection element is provided on an end of the projection protruding out from the shell, to which the transmission line is connectable, and at least one conductor extends through a window that is located in the base element adjoining the bore in the projection and opens to the interior of the housing.

12 Claims, 3 Drawing Sheets

(51) Int. Cl.
*H01R 13/527* (2006.01)
*H02G 3/08* (2006.01)
*H01R 24/76* (2011.01)

(58) Field of Classification Search
USPC .............................. 439/578, 607.01, 638, 936
See application file for complete search history.

(56) References Cited

U.S. PATENT DOCUMENTS

| | | | | |
|---|---|---|---|---|
| 5,518,415 A * | 5/1996 | Sano | .................... | H01R 13/521 |
| | | | | 439/204 |
| 5,561,273 A * | 10/1996 | Yamanashi | ............. | F16H 57/04 |
| | | | | 174/151 |
| 5,630,732 A * | 5/1997 | Yamanashi | ........ | H01R 13/5216 |
| | | | | 439/589 |
| 6,511,337 B1 * | 1/2003 | Fandrey | ............... | H05K 7/1462 |
| | | | | 439/206 |
| 7,118,415 B2 * | 10/2006 | Konda | ................. | H01R 13/025 |
| | | | | 439/578 |
| 7,445,481 B2 * | 11/2008 | Nagashima | .......... | H01R 13/521 |
| | | | | 439/276 |
| 7,766,690 B2 * | 8/2010 | Walker | ................. | H01R 13/432 |
| | | | | 439/447 |
| 8,192,230 B2 * | 6/2012 | Kataoka | .............. | B60R 16/0207 |
| | | | | 439/604 |
| 8,591,243 B2 * | 11/2013 | Brune | .................. | H01R 13/523 |
| | | | | 439/276 |
| 8,626,087 B2 * | 1/2014 | Vanderaa | ............. | H05K 7/1462 |
| | | | | 455/41.2 |
| 8,845,361 B2 * | 9/2014 | Magno, Jr. | ........... | H02G 15/013 |
| | | | | 439/587 |
| 9,039,442 B2 * | 5/2015 | Rapisarda | ............... | F21V 23/06 |
| | | | | 439/500 |
| 2011/0014882 A1 | 1/2011 | Vanderaa | | |

* cited by examiner

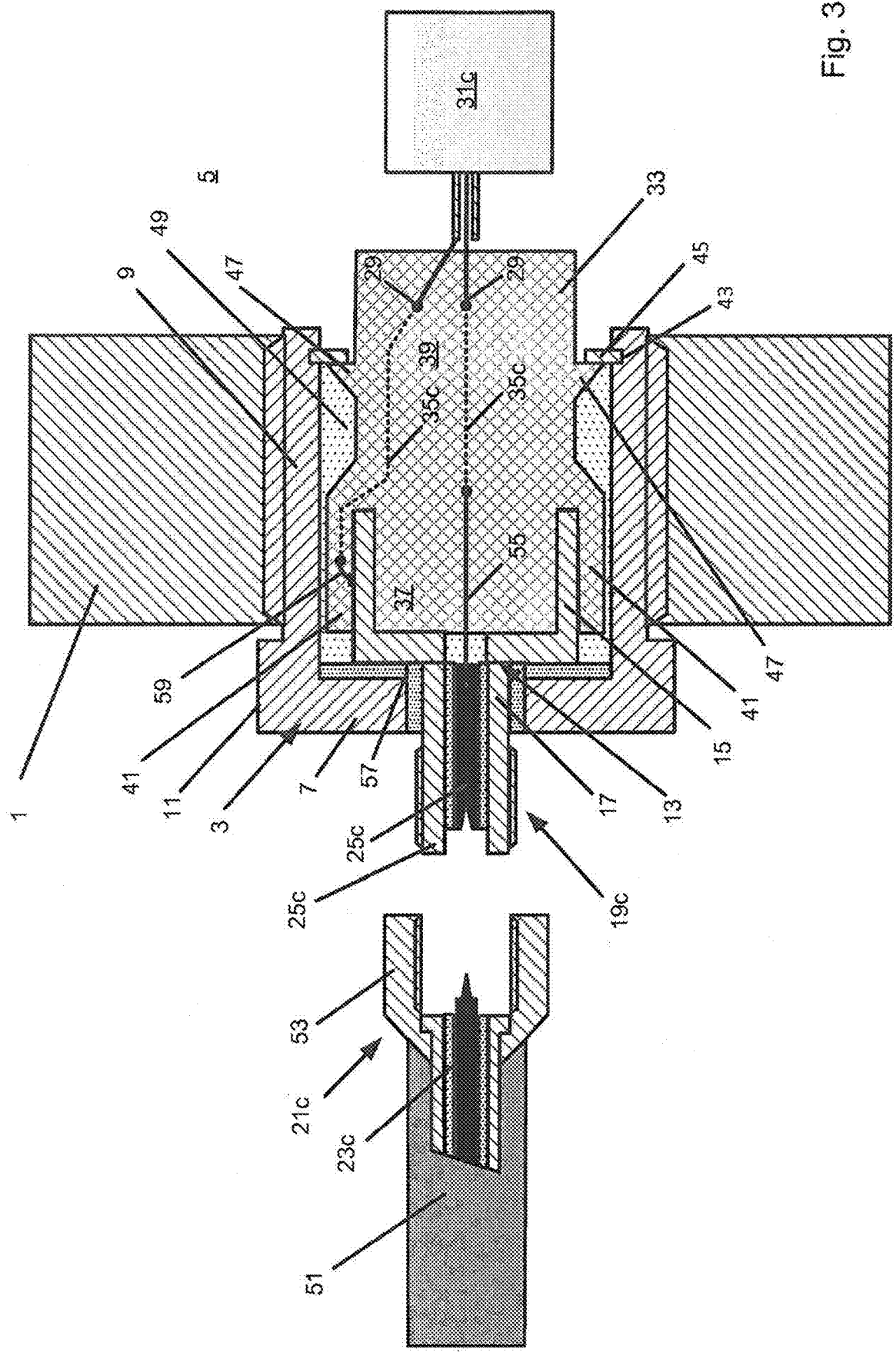

ADAPTER FOR CONNECTING A TRANSMISSION LINE TO A FIELD DEVICE

TECHNICAL FIELD

The invention relates to an adapter for connecting a transmission line to a field device.

BACKGROUND DISCUSSION

Field devices are devices, which have an electronics and which are applied in the field, especially in industrial plants. Field devices include especially measuring devices, which metrologically register a physical, measured variable, e.g. a flow, a pressure or a fill level. Field devices are applied e.g. in industrial measuring- and automation technology. There, they are applied for, among other things, registering information, especially measured values and/or process parameters. The information registered by one or more field devices is transmitted, on a schedule, to one or more receivers. The receivers are, as a rule, superordinated units, such as e.g. computers, controllers and/or process control systems, which process the transmitted information, display it and/or apply it for open- and/or closed-loop control of processes, such as e.g. industrial manufacturing- or processing methods. There are, however, also applications, in the case of which information is transmitted from field device to field device.

Besides information transfer from field device to receiver, frequently also there is information transfer from a superordinated unit to a field device. In this way, e.g., data are transmitted for adjusting, parametering and/or configuring a field device, as well as for matching the field device to tasks, e.g. specific measuring tasks, to be executed by it.

The uni- or bidirectional information transfer between a field device and a receiver, e.g. a superordinated unit or another field device, occurs via a transmission line connected to electronics present in the field device.

Electrical signals bearing the information are transmitted via the transmission line. The various signal forms in industrial use for this purpose ranges from wire-transmittable, analog and digital signals to wirelessly transmittable, high-frequency signals.

Among the analog signal forms is e.g. that frequently referred to in the industry as a 4-20 mA signal. In the case of this transmission form, a signal current flows via the transmission line, e.g. a 2-wire line, and is controlled as a function of a variable, e.g. a measured variable, determined by the field device, to values between 4 mA and 20 mA.

Among the digital signal forms are e.g. digital signals transmittable via bus lines, such as those used in bus line systems, such as e.g. HART, Profibus PA, Profibus DP, ModBus or Ethernet, for uni- or bidirectional digital communication.

Moreover, in increasing measure, also high-frequency signals are applied, such as those used, for example, for wireless communication via digital radio- or mobile radio networks. Various transmission standards have been established for these networks, such as e.g. Global System for Mobile communication (GSM), Bluetooth, WiFi or Near Field Communication (NFC). In these cases, the transmission line connected to the field device is a coaxial line of an antenna, via which the signals are sent and/or received wirelessly.

Both for wired as well as also for wireless information transfer, an adapter is required, via which the electronics arranged within the housing of the field device can be connected to a transmission line located outside of the housing. The adapter must have at least one means, by which the conductors of the transmission line are led through an opening in a housing wall of the housing of the field device.

In such case, field devices usable in explosion-endangered regions must meet special safety requirements. These have the goal of preventing spark formation in the field device, or preventing that sparks occurring in the interior of the field device affect the environment. This goal is attainable in different ways, which are referred to in corresponding European standards as ignition protection classes. A protection class entitled 'pressure-resistant encapsulation' (Ex-d) provides that devices must have a pressure-resistant housing, to assure that a spark in the interior of the housing, namely a spark possibly even triggering an explosion in the interior of the field device, cannot ignite an explosive medium located outside of the field device.

In order to achieve a pressure resistant encapsulation, cable feedthroughs extending through the housing walls of these devices must be correspondingly embodied. For this, today, e.g. pressure resistant glass- or ceramic-sealed cable feedthroughs are applied. These usually comprise a metal support, which has a traversing bore. In the bore is a filling of, glass or ceramic, wherein at least one conductor extends through the bore. In the case of these cable feedthroughs, the filling is directly exposed to the pressure of an explosion in the interior of the housing, Correspondingly, the connection between the outer lateral surface of the filling and the inner wall of the bore must be sufficiently strong to withstand the pressure of the explosion. The manufacture of these cable feedthroughs is, consequently, comparatively complicated and expensive. Moreover, the material combinations of filling, conductor and support are limited to those, between which sufficiently pressure resistant connections can be produced. Moreover, there is in the case of these cables guides the problem that the materials usable as filling are, as a rule, hard and/or brittle materials, which have coefficients of thermal expansion, which differ significantly from the coefficient of thermal expansion of the metal support externally surrounding the filling. Due to the different coefficients of expansion, thermomechanical stresses form in these cable feedthroughs as a function of the ambient temperature. In such case, there is, especially in the case of strong temperature changes or extremely high or low environmental temperatures, the danger that stress cracks can arise in the filling, which degrade the sealing and pressure resistance of these cable feedthroughs.

SUMMARY OF THE INVENTION

It is an object of the invention to provide for connecting a transmission line to a field device, especially in explosion-endangered regions, a pressure resistant adapter, which overcomes the disadvantages of the aforementioned state of the art.

To this end, the invention resides in an adapter for connecting a transmission line to a field device, comprising,
  insertable into an opening in a housing wall of a housing of the field device, a shell, which in the assembled state has an interior open to an interior of the housing and closed to the exterior by an end wall of the shell,
  installed in the shell, an insert, which includes a base element arranged in the shell and a projection protruding out of the shell through an opening in the end wall of the shell, wherein the base element has a basal area, which is greater than a basal area of the opening in the end wall of the shell, a connection element, which is provided on an end of the projection protruding out from the shell and to which the transmission line is connectable, extending through a bore in the projection and connected to a connection contact of the connection element, at least one conductor, which extends through a window, which is located in the base element adjoining the bore and which is open to the interior of the housing, and a potting compound, which fills hollow space remaining in the shell.

An embodiment of the adapter of the invention further includes that the shell is composed of a pressure resistant material, especially a metal, especially aluminum, a lost wax casting or stainless steel, and is connectable via a pressure resistant, mechanical connection, especially a screwed connection or a welded joint, with the housing wall of the field device, and/or the potting compound is composed of an epoxide resin or a silicone.

A first further development of the invention adapter includes that a circuit board is provided in the adapter, especially in the insert, the circuit board is equipped with conductive traces, and each of the conductors is connected via one of the conductive traces with an associated connector, via which the particular conductor is connectable to an electronics of the field device.

In a preferred embodiment of the first further development, the conductive traces extend in the circuit board.

Another embodiment of the first further development of the adapter includes that the circuit board is arranged in the adapter in such a manner that it extends through the adapter parallel to the longitudinal axis of the shell, wherein a surface normal to the circuit board area extends perpendicularly to the longitudinal axis of the shell, and/or the circuit board includes a first section installed in the base element and a second section following thereon and leading through the shell.

A further development of the latter embodiment is an adapter, in the case of which the circuit board includes, extending on mutually opposite, external sides of the base element, two circuit board segments, especially leg shaped, circuit board segments, which are connected with the second section of the circuit board and which are separated, in each case, from the first section in the base element by a slot extending through the circuit board and accommodating a wall segment of the base element.

In a further development of the first further development, a securement apparatus is provided, by which the base element and the circuit board applied thereon are affixed in the shell, especially a securement apparatus, which includes a retainer clip seated in a groove in the shell and blocking circuit board protrusions protruding on both sides of the circuit board perpendicular to the longitudinal axis of the adapter, wherein the retainer clip is arranged on the side of the circuit board protrusions away from the end wall of the shell.

A first variant of an adapter of the invention includes that the transmission line is a line comprising at least one conductor, especially a 2-wire line comprising two conductors or a multi-conductor bus line, and for each conductor of the transmission line there extends through the bore in the projection, connected to one of the connection contacts of the connection element of the adapter a conductor, which extends also through the window in the base element adjoining the bore in the projection.

A second variant of an adapter of the invention includes that the transmission line is a coaxial line comprising an inner conductor and a outer conductor, especially a coaxial line of an antenna connectable to the field device, the connection contacts of the connection element comprise a connection contact for the inner conductor and a connection contact for the outer conductor, the connection contact for the inner conductor is connected through the bore in the projection to the conductor extending through the window in the base element, the insert is composed of an electrically conductive material, especially brass or aluminum, the insert forms an outer conductor connected with the connection contact for the outer conductor, and the insert is electrically insulated from the conductor and from the shell.

A further development of the adapter of the invention according to the first further development and the second variant includes that the base element connected with the connection contact for the outer conductor is connected via a conductive trace extending in the circuit board with the associated connector, and the conductive trace, which connects the conductor connected with the connection contact for the inner conductor with the associated connector, extends in the circuit board.

An embodiment of the latter further development includes an adapter, in the case of which the base element is connected via a connecting line, especially a connecting line extending on an outside of the base element, with the associated conductive trace of the circuit board.

A second further development, includes an adapter, in the case of which insert and shell are electrically insulated from one another.

A further development of the latter further development includes an adapter, in the case of which the base element is externally surrounded by a gap filled with the potting compound, and, between the shell and insert, an insulator is provided, which insulates the end wall of the shell from the end wall of the base element and which insulates the projection extending through the opening in the end wall in the shell from such end wall surrounding the opening, especially an insulator, which includes an annular, washer shaped, first insulator region arranged between the end wall of the shell and the end wall of the base element and a surrounding second insulator region, which follows thereon and which surrounds the projection externally on all sides, especially an insulator of a pressure resistant material or an insulator whose first insulator region is composed of a pressure resistant material, especially ceramic, a pressure resistant plastic or a circuit board base material, especially an epoxy resin soaked, glass fiber mat.

In an additional further development, the shell filled with the potting compound is embodied as a flame penetration barrier.

Additionally, the invention includes a field device with an adapter of the invention and an electronics connectable to a transmission line via the adapter.

Adapters of the invention offer the advantage that the pressure resistance against an explosive pressure possibly arising in the interior of the field device is effected by the support of the base element of the insert on the end wall of the shell. In contrast to the above mentioned pressure resistant glass- or ceramic cable feedthroughs, in the case of adapters of the invention, consequently, no pressure resistant connection between the potting compound and the potted components of the adapter is required.

This offers the advantage that the potting compound can be a significantly more elastic material in comparison to glass or ceramic, an elastic material that is able to absorb thermomechanical stresses occurring from different thermal coefficients of expansion of the components of the adapter. In this way, stress cracks in the potting compound are prevented, so the adapter of the invention can be applied in a greater temperature range than conventional cable feedthroughs. In such case, the shell filled with the potting compound can be embodied as a flame penetration barrier reliable over a correspondingly large temperature range.

A further advantage provides that, due to the simply constructed components, for whose assembly no special joining methods are required, adapters of the invention can be produced in simple and cost effective manner.

BRIEF DESCRIPTION OF THE DRAWINGS

The invention and other advantages will now be explained in greater detail based on the figures of the drawing, in which three examples of embodiments are shown; equal parts are provided in the figures with equal reference characters.

The figures of the drawing show as follows:

FIG. 3 is an adapter installed in a housing wall of a field device for a coaxial line of an antenna.

DETAILED DISCUSSION IN CONJUNCTION WITH THE DRAWINGS

Figure 1:
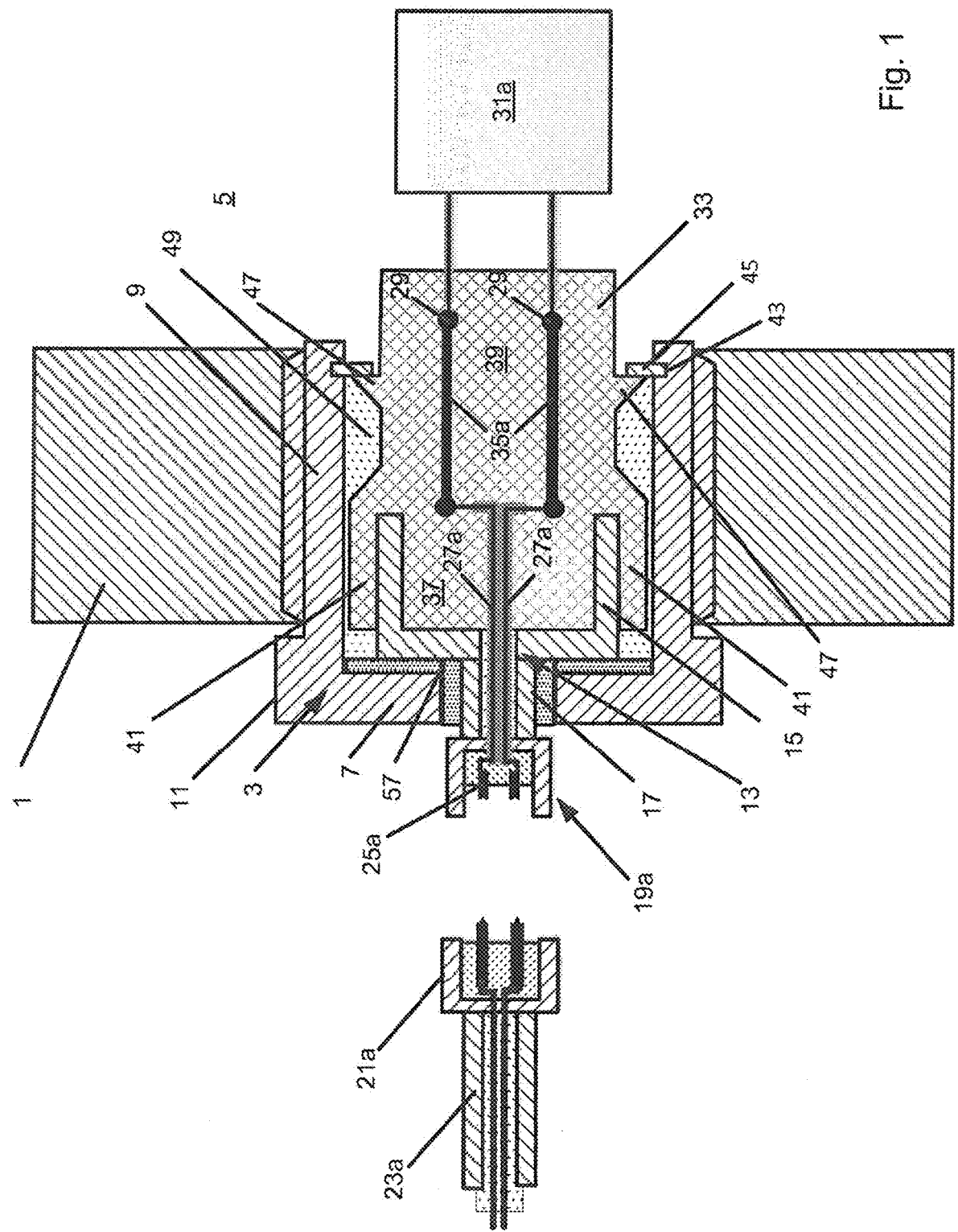
FIG. 1 is an adapter installed in a housing wall of a field device for a 2-wire line.

FIG. 1 shows a sectional view of a first example of an embodiment of an adapter of the invention for a field device. The adapter includes a shell 3, which is insertable into an opening in a housing wall 1 of a housing and which in the assembled state has an interior open to an interior 5 of the housing and closed to the exterior by an end wall 7. Housing and shell 3 are made of a pressure resistant material, e.g. a metal, e.g. an aluminum, a lost wax casting, or stainless steel, and are connected with one another via a pressure resistant, mechanical connection, especially a screwed connection or a welded joint. In the case of the screwed connection illustrated here, the shell 3 includes preferably a hollow cylindrical shank 9 provided with an external screw thread and a screw head 11, e.g. a hexagonal head, comprising the end wall 7. In such case, the opening in the housing wall 1 is provided with an internal thread, into which the threaded shank 9 is screwed-in. In such case, the screw threads have preferably a thread length sufficiently great for achieving a highly pressure resistant, mechanical connection, especially a connection with a pressure resistance sufficient for withstanding pressures up to 80 bar. Corresponding minimum thread lengths can be taken, for example, from European or international standards for the ignition protection class, pressure resistant encapsulation. The screw head 11 can—such as shown here—lie against the outside of the housing wall 1 surrounding the opening, or, however, alternatively be arranged sunk in the housing wall 1.

Additionally, the adapter 3 includes, within the shell 3, an insert 13. Insert 13 includes a base element 15 arranged in the interior of the shell 3 and a projection 17 adjoining the base element 15, and protruding out of the shell through an opening in the end wall 7 of the shell 3. Base element 15 has a basal area, which is greater than a basal area of the opening in the end wall. In this way, the end wall 7 of the shell 3 forms a stable abutment for insert 13, for directly withstanding pressure of an explosion in the interior of the housing.

Provided on the end of the projection 17 protruding out from the opening in the end wall 7 of the shell 3 is a—here only schematically illustrated—connection element 19a, to which is connectable a transmission line 23a equipped with a likewise only schematically illustrated connection element 21a complementary to connection element 19a.

Additionally, the adapter includes, extending through a bore in the projection 17 and connected to an associated connection contact 25a of the connection element 19a of the adapter, at least one conductor 27a, which extends through a window, which is located in the base element 15 adjoining the bore and which is open to the interior of the housing 5.

In the example of an embodiment illustrated in FIG. 1, the transmission line 23a is a 2-wire line. Correspondingly, the adapter, in such case, has two conductors 27a extending through insert 13, which can be connected to the two conductors of the transmission line 23a via the two connection elements 19a, 21a.

Additionally, the adapter includes connectors 29, via which the ends of the conductors 27a away from the connection element 19a of the adapter are connectable to an electronics 31a arranged in the interior of the housing of the field device. The connectors 29 are in the illustrated example of an embodiment connection contacts, to which a corresponding line can be connected e.g. by soldering. Alternatively, the connectors 29 can be embodied as a plug or plug connectors. In the illustrated example of an embodiment, the electronics 31a includes e.g. a circuit, via which an electrical current flowing via the 2-wire line can be set in such a manner that it corresponds to a physical measured variable measured by the field device. Additionally, in the case of corresponding embodiment of the electronics 31a, also the energy supply of the field device can occur via the 2-wire line. Corresponding circuits are known from the state of the art, and, consequently, are not described here in detail.

Fundamentally, it would be possible to lead the conductors 27a in a cable jacket through the shell 3 and to connect directly on the electronics 31a. Such a procedure is, however, in many countries, due to explosion protection specifications, not allowable for field devices usable in explosion-endangered regions, since cable jackets are regularly of flowable plastics unsuitable for use in explosion-endangered regions and represent a safety risk in the form of a gap between conductors 27a and cable jacket leading to the interior 5 of the housing.

Connection of the conductors 27a to the electronics 31a occurs, consequently, preferably via a circuit board 33 in the adapter. Circuit board 33 is equipped with a number of conductive traces 35a corresponding to the number of conductors 27a, and the conductors 27a are connected with the associated connector 29 by the conductive traces 35a. The conductive traces 35a can—such as shown in FIG. 1—extend on the circuit board 33, or alternatively also be embodied as conductive traces extending in the circuit board 33.

Circuit board 33 is preferably arranged in the adapter in such a manner that it extends through the adapter parallel to the longitudinal axis of the shell 3, wherein a surface normal to the circuit board area extends perpendicularly to the longitudinal axis of the shell 3.

Circuit board 33 includes a first section 37 installed in the base element 15 and a second section 39 following thereon and leading through the shell 3. Preferably, the circuit board 33 includes, supplementally, two mutually oppositely lying, preferably leg shaped, circuit board segments 41 extending externally on the sides of the base element 15 and connected with the second section 39 of the circuit board 33. These circuit board segments 41 are, in each case, separated from the first section 37 in the base element 15 by slots in the circuit board 33. This offers the advantage that the circuit board 33 can be plugged onto the base element 15, wherein the slots accommodate, in each case, a wall segment of the base element 15.

Additionally, the adapter includes a securement apparatus, by which the base element 15 and the circuit board 33 applied thereon are affixed in the shell 3. Suited for this is e.g. a retainer clip 45 seated in a groove 43 in the threaded shank 9 and blocking circuit board protrusions 47 protruding on both sides of the circuit board 33 perpendicularly to the longitudinal axis of the adapter 3. In such case, the retainer clip 45 is arranged against the side of the circuit board protrusions 47 away from the end wall 7 of the shell 3, so that it prevents movement of the composite of insert 13 and circuit board 33 installed in the insert 13 in the direction away from the end wall 7.

In the case of adapters of the invention, hollow space remaining in the interior of the shell 3 is filled with a potting compound 49. The potting compound 49 also fills hollow space remaining in the insert 13 after insertion of the circuit board 33 into the base element 15. Moreover, preferably also hollow space remaining in the projection 17 is filled with the potting compound 49 or alternatively with an insulator installed therein.

The shell 3 filled with potting compound 49 is preferably embodied as a flame penetration barrier, which prevents that a spark occurring in the field device can bring about ignition of an explosive medium located outside of the field device. Requirements for hollow spaces filled with a potting compound and usable as flame penetration barriers are set in many countries by corresponding explosion protection standards, which can be taken into consideration here for corresponding embodiment of shell 3 and potting compound 49. According to an embodiment, e.g. according to German Industrial Standard DIN-EN 60079-1 of year 2007, in connection with the protection class, pressure resistant encapsulation (Ex-d), the shell 3 must be dimensioned in such a manner that the shortest path extending in the potting compound 49 through the adapter in the case of a total volume of the potting compound 49 of less than 10 cm$^3$ amounts to at least 3 mm, in the case of a total volume of the potting compound 49 of greater than 10 cm$^3$ and less than 100 cm$^3$ at least 6 mm, as well as in the case of a total volume of the potting compound 49 of greater than 100 cm$^3$ at least 10 mm.

By combination of the pressure resistant support of the base element 15 of insert 13 against the end wall of the shell 3 and the flame penetration barrier effected by the shell 3 filled with potting compound 49, the adapter can be used in explosion-endangered regions.

In contrast to the above mentioned, pressure resistant glass- or ceramic cable feedthroughs, in the case of adapters of the invention, no pressure resistant connection between the potting compound 49 and the components of the adapter surrounding the potting compound 49 is required. Instead of that, the pressure of an explosion in the interior of the field device is absorbed in the case of adapters of the invention by the support of the base element 15 on the end wall 7 of the shell 3.

This offers the advantage that the potting compound 49 can be of a material, e.g. a resin, e.g. an epoxide resin, or a silicone, significantly more elastic than glass or ceramic. More elastic potting compound materials offer the advantage that they can absorb thermomechanical stresses occurring from different coefficients of thermal expansion of the components of the adapter. In this way, stress cracks in the potting compound 49 are avoided when the adapter is exposed to large temperature fluctuations and/or to very high or very low temperatures.

Figure 2:
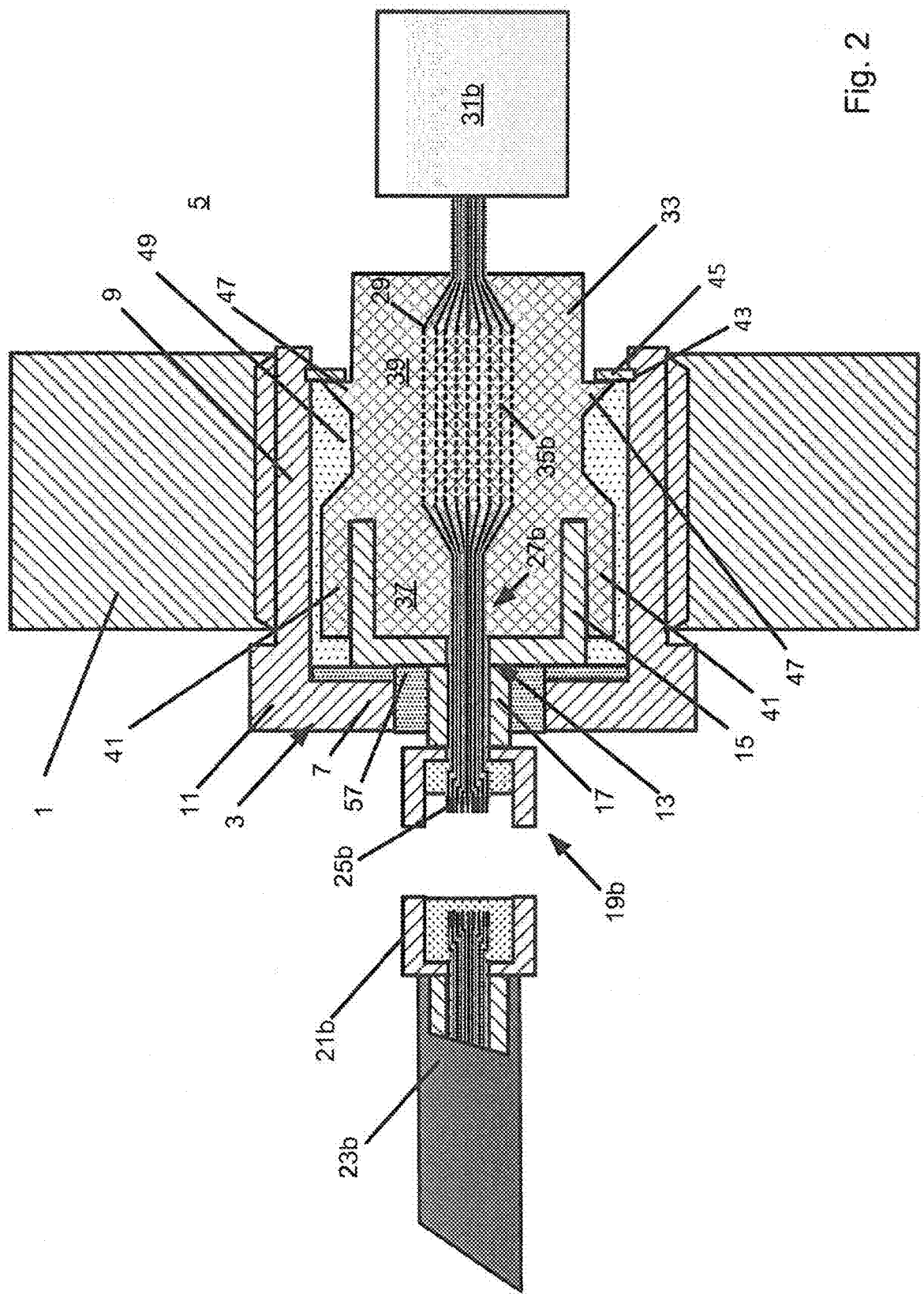
FIG. 2 is an adapter installed in a housing wall of a field device for a bus line.

FIG. 2 shows a second example of an embodiment of an adapter of the invention. This differs from that illustrated in FIG. 1 in that this adapter is designed for the connection of a multi-wire transmission line 23b—here in the form of a bus. Correspondingly, adapter and transmission line 23b are here equipped with connection elements 19b, 21b suitable for the connection of a bus line, such as e.g. connection elements known from the state of the art, which, depending on bus line system, are, as a rule, 9-pole or 12-pole, plug connectors. In such case, there is for each conductor of the bus line a conductor 27b located in the adapter, connected to the corresponding connection contact 25b of the connection element 19b of the adapter and led through the projection 17. The conductors 27b are also here preferably, in each case, connected to an associated conductive trace 35b of the circuit board 33, via whose connector 29, e.g. a connection contact, a plug or plug connector, it then can be connected on the electronics 31b of the field device. The electronics 31b includes, in this case, a data transmission module that performs the digital communication via the bus line. Since digital communication via bus lines regularly occurs via higher frequency signals, the conductive traces 35b extend here preferably within the circuit board 33, In this way, interactions of the higher frequency signals with the potting compound 49 are prevented.

FIG. 3 shows a further example of an embodiment of an adapter of the invention. This differs from the preceding examples of embodiments in that it is embodied for the connection of a transmission line 23c in the form of a coaxial line. Transmission line 23c is e.g. a coaxial line of an antenna 51, via which high-frequency signals are sent and/or received wirelessly. Correspondingly, adapter and transmission line 23c are here equipped with connection elements 19c, 21c suitable for the connection of a coaxial line, such as e.g. SMA-plug connectors or F-plug connectors known from the state of the art, via which the antenna 51 can be mechanically secured and electrically connected to the adapter, preferably by means of a coupling nut 53 provided on the connection element 21c of the antenna 51.

Also in the case of this variant, it would be basically possible to lead inner- and outer conductors of the coaxial line through the bore in the projection 17 and into the adapter.

Preferably, here, however, another approach is followed. In such case, insert 13 is used as outer conductor, so that only the inner conductor of the coaxial line must be led through the bore in the projection 17. To this end, insert 13 is composed of an electrically conductive material, e.g. brass or aluminum, and only one conductor 55 is provided connected with the connection 25c of the connection element 19c for the inner conductor of the coaxial line through the bore in the projection 17. Conductor 55 is electrically insulated from insert 13 and extends through the window in the base element 15 adjoining the bore. For insulating the conductor 55 from the projection 17, there is provided in the hollow cylindrical gap located between the part of the conductor 55 extending through the projection 17 and the projection 17 e.g. a spacer or a filling of a dielectric. In the case of this variant, the essentially hollow-cylindrical projection 17 preferably forms at the same time the connection contact 25c of the connection element 19c for the outer conductor.

This variant can be produced extremely cost effectively, in that a conventional connection element for the connection of coaxial lines, such as e.g. an SMA- or F-plug connector, is mounted, e.g. soldered on, to the insert 13, Projection 17 forms the outer conductor of the plug connector and the inner conductor is formed by the part of the conductor 55 extending through the bore in the projection 17, to which then the part of the conductor 55 extending through the window in the base element 15 is connected.

Insert 13 and shell 3 are preferably electrically insulated relative to one another. In the case of the example of an embodiment illustrated here, the base element 15 is externally insulated from the shell 3 by the potted hollow cylindrical gap externally surrounding the base element 15, between base element 15 and shell 3. Additionally, there is provided between the shell 3 and insert 13 an insulator 57, which insulates between the end wall 7 of the shell 3 and the end wall of the base element 15, as well as between the projection 17 extending through the opening in the end wall 7 in the shell 3 and the end wall 7 surrounding the opening. Insulator 57 includes e.g. an annular, washer shaped, first insulator region arranged between the end wall 7 of the shell 3 and the end wall of the base element 15 and a second insulator region following thereon and externally surrounding the projection 17 on all sides. The second insulator region is preferably embodied in such a manner that it completely fills a gap existing between the projection 17 and the opening in the end wall 7.

In such case, the first insulator region arranged between the end wall 7 of the shell 3 and the end wall of the base element 13 is composed preferably of a pressure resistant material, e.g. a ceramic. Alternatively here, also a pressure resistant, insulating plastic or a pressure resistant, insulating circuit board material, e.g. that known under the name FR4 and composed of epoxy resin soaked glass fiber mats, can be used. If the insulator 57 is embodied as a single piece, then it is composed preferably totally of this material. If the insulator 57 is embodied in two parts, then the second insulator region can be of another material, e.g. an insulating potting compound.

Insulation between insert 13 and shell 3 is preferably also provided in the case of the examples of embodiments illustrated in FIGS. 1 and 2. Also in such cases, such as shown in FIGS. 1 and 2, it can be implemented by the potted hollow cylindrical gap between base element 15 and shell 3 and the insulator 57 provided between the shell 3 and insert 13.

The insulation offers the advantage that it effects an insulation between the potential of insert 13 and the potential of the shell 3 connected in use with the housing wall 1 and lying therewith at the potential of the housing, which is, as a rule, grounded.

In the case of the example of an embodiment illustrated in FIG. 3, the circuit board 33 is equipped with two conductive traces 35c, via which the conductor 55 continuing the inner conductor and the base element 15 continuing the outer conductor are connected with their associated connectors 29 provided on the section 39 of the circuit board 33 away from the base element 13. For this, the conductor 55 is connected directly with its conductive trace 35c of the circuit board 33, and the base element 15 is connected via a connecting line 59 to its conductive trace 35c of the circuit board 33. Connecting line 59 extends preferably on the outside of the base element 15 and is, for example, connected to its conductive trace 35c on one of the two leg shaped circuit board segments 41 externally directly adjoining the base element 13.

The conductive traces 35c extend also here preferably within the circuit board 33. In this way, interactions of the transmitted signals with the potting compound 49 are avoided.

Correspondingly, signals can be directly transmitted with the adapter of the invention, which have frequencies, such as are used in connection with the above mentioned transmission standards, Global System for Mobile communication (GSM), Bluetooth, WiFi, or Near Field Communication (NFC). These transmission standards use, depending on standard frequency ranges, in the range of some hundred mega-hertz up to frequencies of one or two giga-hertz. In such case, the data transmission rate is, as a rule, higher, the higher the frequencies used for transmission.

By suitable choice of materials of circuit board 33 and insert 13 and a frequency matched dimensioning of insert 13, even signals having yet higher frequencies can be transmitted. Thus, for example, with a circuit board 33 of ceramic and a correspondingly dimensioned insert 13 of brass, signals with frequencies of 5 GHz and more can be transmitted, via which correspondingly higher data transmission rates can be achieved.

The connectors 29, formed also here e.g. as connection contacts, plugs or plug connectors, are connected in the field device via a coaxial line to the electronics 31c integrated in the field device, which, in this case, comprises a high-frequency module embodied corresponding to the transmission standard selected for sending and/or receiving the high-frequency signals transmitted via the transmission line 23c, or the antenna 51.

The invention claimed is:

1. An adapter for connecting a transmission line to a field device, wherein the device includes a housing having a housing wall with an opening, the adapter comprising;
    a shell insertable into said opening in said housing, wherein in an inserted state, the shell opens to an interior of the housing and closed to an exterior by an end wall of the shell;
    an insert including a base element with a window located in said base element and a projection, wherein the base element is arranged in said shell and said projection protrudes out of said shell through an opening in the end wall of said shell, wherein the base element has a basal area, wherein the basal area is greater than a basal area of the opening in the end wall of said shell;
    a connection element provided on an end of said projection and connected to the transmission line;
    a plurality of conductors extending through a bore in said projection and connected to a connection contact of said connection element, through said window of said base element, wherein said base element adjoins the bore in said projection and opening to the interior of the housing; and
    a potting compound filling a hollow space remaining in said shell; and a circuit board in said insert, wherein said circuit board is equipped with conductive traces, and each conductor is connected via one of said conductive traces with an associated connector, wherein with said conductive traces the conductor is connectable to an electronics of the field device.

2. The adapter as claimed in claim 1, wherein:
said shell is composed of a pressure resistant aluminum metal material, a lost wax casting or stainless steel, and is connectable via a pressure resistant, mechanical connection, screwed connection or a welded joint, with said housing wall of the field device, and/or
said potting compound is composed of an epoxide resin or a silicone.

3. The adapter as claimed in claim 1, wherein:
said conductive traces extend in said circuit board.

4. The adapter as claimed in claim 3, wherein:
said circuit board includes, extending on mutually opposite, external sides of said base element, two leg shaped circuit board segments connected with said second section of said circuit board and separated, in each case, from said first section in said base element by a slot extending through said circuit board and accommodating a wall segment of said base element.

5. The adapter as claimed in claim 1, wherein:
said circuit board is arranged in the adapter in such a manner that said circuit board extends through the adapter parallel to a longitudinal axis of said shell;
a surface normal to said circuit board area extends perpendicularly to the longitudinal axis of said shell; and/or
said circuit board includes a first section installed in the base element and a second section following thereon and leading through said shell.

6. The adapter as claimed in claim 1, further comprising:
a securement apparatus affixing said base element and said circuit board in said shell, wherein said securement apparatus includes a retainer clip seated in a groove in said shell and blocking circuit board protrusions protruding on both sides of said circuit board perpendicular to the longitudinal axis of the adapter, wherein:
said retainer clip is arranged on the side of said circuit board protrusions away from said end wall of said shell.

7. The adapter as claimed in claim 1, wherein:
said transmission line is a coaxial line comprising an inner conductor and an outer conductor;
connection contacts of said connection element comprise a connection contact for said inner conductor and a connection contact for said outer conductor;
said connection contact for said inner conductor is connected through the bore in said projection to said conductor extending through the window in said base element;
said insert is composed of an electrically conductive brass or aluminum material;
said insert forms an outer conductor connected with said connection contact for said outer conductor; and
said insert is electrically insulated from said conductor and from said shell.

8. The adapter as claimed in claim 7, wherein said coaxial line is a coaxial line of an antenna connectible to the field device.

9. The adapter as claimed in claim 1, wherein:
said base element is connected via a connecting line extending on an outside of said base element, with the associated conductive trace of said circuit board.

10. The adapter as claimed in claim 1, wherein:
said insert and said shell are electrically insulated from one another.

11. The adapter as claimed in claim 1, wherein:
said shell filled with said potting compound is embodied as a flame penetration barrier.

12. A field device with the adapter as claimed in claim 1; and
an electronics connectable to said transmission line via said adapter.

* * * * *